US012719017B2

(12) United States Patent
Song et al.

(10) Patent No.: US 12,719,017 B2
(45) Date of Patent: Aug. 25, 2026

(54) METHOD FOR DOPING TWO-DIMENSIONAL MATERIAL BASED ON CLUSTER ION IMPLANTATION

(71) Applicants: Jiangsu Jichuang Atomic Cluster Technology Research Institute Co., Ltd., Nanjing City (CN); Nanjing University, Nanjing City (CN)

(72) Inventors: Fengqi Song, Nanjing City (CN); Minhao Zhang, Nanjing City (CN); Xueyu Liu, Nanjing City (CN); Sichen Tang, Nanjing City (CN); Ning Chen, Nanjing City (CN)

(73) Assignees: Jiangsu Jichuang Atomic Cluster Technology Research Institute Co., Ltd., Nanjing City (CN); Nanjing University, Nanjing (CN)

( * ) Notice: Subject to any disclaimer, the term of this patent is extended or adjusted under 35 U.S.C. 154(b) by 295 days.

(21) Appl. No.: 18/655,970

(22) Filed: May 6, 2024

(65) Prior Publication Data

US 2025/0132126 A1 Apr. 24, 2025

(30) Foreign Application Priority Data

Oct. 19, 2023 (CN) ......................... 202311357685.0

(51) Int. Cl.
*H01J 37/317* (2006.01)
*H01J 37/24* (2006.01)

(52) U.S. Cl.
CPC ........ *H01J 37/3171* (2013.01); *H01J 37/243* (2013.01); *H01J 2237/30427* (2013.01); *H01J 2237/31706* (2013.01)

(58) Field of Classification Search
None
See application file for complete search history.

(56) References Cited

U.S. PATENT DOCUMENTS

2022/0157948 A1* 5/2022 Suzuki .................. H10D 62/60

FOREIGN PATENT DOCUMENTS

CN 104376217 B * 5/2016
CN 113454756 A * 9/2021 ............ H10P 30/208

* cited by examiner

*Primary Examiner* — Andrew Smyth
(74) *Attorney, Agent, or Firm* — MUNCY, GEISSLER, OLDS & LOWE, P.C.

(57) ABSTRACT

A method for doping a two-dimensional material based on cluster ion implantation, including selecting a two-dimensional material sample to place same on a substrate; determining the selected implantation parameters by Monte Carlo particle tracing algorithm on the two-dimensional material sample; replacing the two-dimensional material sample, and placing a two-dimensional material thin film, wherein the thickness of the two-dimensional material thin film is ≤10 nm; selecting a determined implantation parameter to form a cluster beam and acting on a two-dimensional material thin film; changing the implantation parameters to form different cluster beams and acting on the two-dimensional material thin film; performing annealing on the two-dimensional material thin film implanted with cluster ions to repair the damage caused by implantation. The method is applicable to two-dimensional semiconductor materials by using ion clusters for implantation such that damage to the crystal lattice by the ion implantation is reduced.

10 Claims, 8 Drawing Sheets

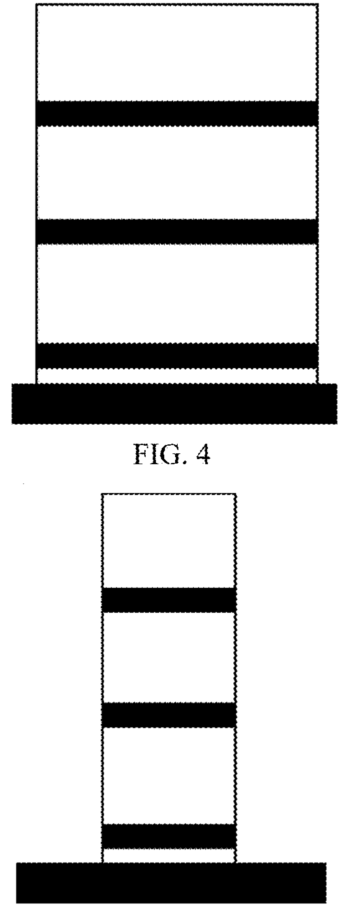
FIG. 4
FIG. 5
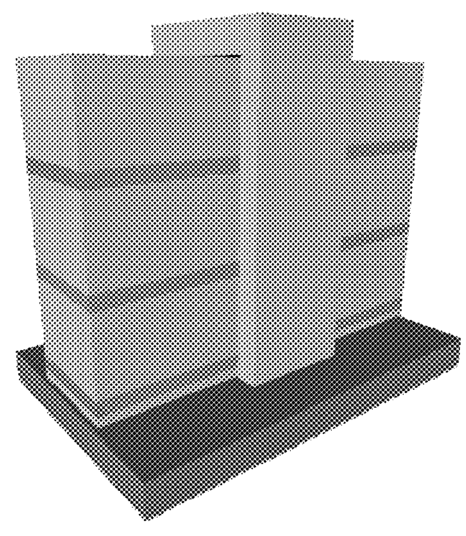
FIG. 6

Ion Distribution

Ion Range = 9 A Skewness = 1550623.145

Straggle = 3 A Kurtosis = 1092637422.287

METHOD FOR DOPING TWO-DIMENSIONAL MATERIAL BASED ON CLUSTER ION IMPLANTATION

TECHNICAL FIELD

The present invention is in the field of advanced electronic component technology and particularly relates to a method for doping a two-dimensional material based on cluster ion implantation.

BACKGROUND ART

To date, field effect transistor (FET) technology based on two-dimensional materials of transition metal dichalcogenide (TMD) is the material of choice for sub-nano-transistors as the node of the chip process is further scaled down to 3 nm, and therefore Moore's law is expected to continue. In addition, with the accelerated termination of Moore's law, the international semiconductor roadmap shows that new materials dominated by broad band-gap semiconductors, carbon nanotubes, two-dimensional layered materials, and new principles dominated by tunneling transistors, negative capacitance transistors, and spin transistors become a favorite of the latter Moore devices as feature sizes approach the limit. Molybdenum disulphide and molybdenum diselenide, are well-known two-dimensional layered semiconductor materials. Since the successful preparation of their transistors, after 10 years of research, ultra-small size molybdenum disulfide transistors have been verified so far.

Studies have found that doping based on two-dimensional semiconductor materials is difficult, which leads to great challenges in the fabrication of complementary field-effect transistors based on two-dimensional materials, such as the current state of the art TMD materials: there have been some solutions for P-type doping of TMD, such as oxygen plasma doping, but P-type doping of TMD materials has not always been a good solution.

With regard to a conventional semiconductor material, doping by means of ion implantation is a conventional means; however, with regard to a two-dimensional semiconductor material, it is generally considered that since the two-dimensional semiconductor material only has an atomic layer-level thickness, and the crystal lattice thereof is highly vulnerable to damage during this process, the ion implantation method is not applicable to the two-dimensional semiconductor material.

SUMMARY OF THE INVENTION

With regard to the above-mentioned problems, the present invention improves the conventional ion implantation method so that the ion implantation method can be applied to a two-dimensional material, thereby solving industrial problems and providing a valuable process reference for chip preparation based on a two-dimensional material such as TMD (transition metal disulfide).

The present invention provides a method for doping a two-dimensional material based on cluster ion implantation, comprising the following steps:

S1. selecting a two-dimensional material sample to place it on a substrate;

S2. determining selected implantation parameters by Monte Carlo particle tracing algorithm on a two-dimensional material sample;

S3. replacing the two-dimensional material sample, and placing a two-dimensional material thin film, wherein a thickness of the two-dimensional material thin film is ≤10 nm;

S4. selecting a determined implantation parameter to form a cluster beam and acting on a two-dimensional material thin film;

S5. changing the implantation parameters to form different cluster beams and acting on the two-dimensional material thin film;

S6. performing annealing on the two-dimensional material thin film implanted with cluster ions to repair the damage caused by implantation;

the Monte Carlo particle tracing algorithm uses computer simulation to obtain the relationship between an implantation parameter and an implantation depth; according to the simulation result, selecting implantation parameters, wherein the implantation parameters comprise the energy size of the cluster ion beam, the size of the cluster and the element type of the cluster; the cluster beam formed after selecting the parameters is implanted into the two-dimensional material sample, and the simulation results are corrected by debugging the selected parameters to obtain the numerical distribution after the clusters implanted into the sample and the substrate thereof, and then the relationship between the actual implantation parameters and the implantation depth is obtained, and the selected implantation parameters are determined.

Preferably, the substrate is a semiconductor material or an insulator material.

Preferably, the semiconductor material is silicon, silicon dioxide, or graphene oxide; the insulator material is sapphire, mica sheet, or alumina.

Preferably, the two-dimensional material is a transition metal dichalcogenide (TMD).

Preferably, the elements of the clusters are $Nb_n^+$ clusters of positively charged ion clusters or $As_n^-$ clusters of negatively charged ion clusters; the n≥2.

Preferably, the two-dimensional material is MoSe2, and a Monte Carlo particle tracing algorithm is used to trace the implantation depth of a MoSe2 sample implanted on a substrate by $Nb_{10}^+$ clusters at an energy of 3 keV; a cluster beam source is used to debug the beam of Nb atom clusters; after the cluster beam debugging is completed, a certain amount of cluster implantation is completed on the $MoSe_2$ thin film using $Nb_{10}^+$ clusters; after the sample implantation is completed, an annealing process is used to stabilize the crystal lattice thereof.

Preferably, the annealing process is annealing at 500° C. for 2 h in a nitrogen atmosphere.

Preferably, the two-dimensional material is $MoS_2$, and a Monte Carlo particle tracing algorithm is used to accurately trace the implantation movement of clusters under different energies, so as to obtain a specific implantation depth under different acceleration energies; $MoS_2$ is prepared as an implanted sample using a chemical vapour deposition method, and the Raman spectrum measurement is performed thereon; $Nb_{10}^+$ clusters are implanted, and after the sample implantation is completed, an annealing process is used to stabilize the crystal lattice thereof.

Preferably, the annealing process is annealing at 300° C. for 2 h in a nitrogen atmosphere.

A method for preparing a transistor device using the method for doping a two-dimensional material based on cluster ion implantation, specifically including: selecting a two-dimensional material TMD to place it on a substrate;

determining selected implantation parameters, and performing a first cluster ion implantation on the two-dimensional material TMD sample placed on the substrate, wherein the cluster ion energy usage value is 9 keV; then performing a second cluster ion implantation, wherein the cluster ion energy usage value is 6 keV; then performing a third cluster ion implantation, wherein the cluster ion energy usage value is 3 keV, and similar stacked P-type and N-type regions are formed in the sample; performing annealing on the sample; preparing samples for grid and peripheral circuitry.

In conventional ion implantation, the ions are typically single ions, and the present invention makes the method applicable to two-dimensional semiconductor materials by using ion clusters for implantation such that damage to the crystal lattice by the ion implantation is reduced. By modifying the annealing parameters, the crystal lattice is further repaired to achieve better results. Here, a preferred annealing parameter is given for $MoSe_2$ and $MoS_2$, respectively, and a good effect can be achieved.

BRIEF DESCRIPTION OF THE DRAWINGS

FIG. 4 is a schematic cross-sectional view of a two-dimensional material feature after cluster implanted at three different acceleration energies of the present invention;

FIG. 5 is a schematic cross-sectional view of a cluster ion implanted two-dimensional material feature of the present invention after etching annealing;

FIG. 6 is a three-dimensional schematic view of cluster ion implanted two-dimensional full ring gate transistor features of the present invention;

DETAILED DESCRIPTION OF THE INVENTION

Figures 1, 2, 3:
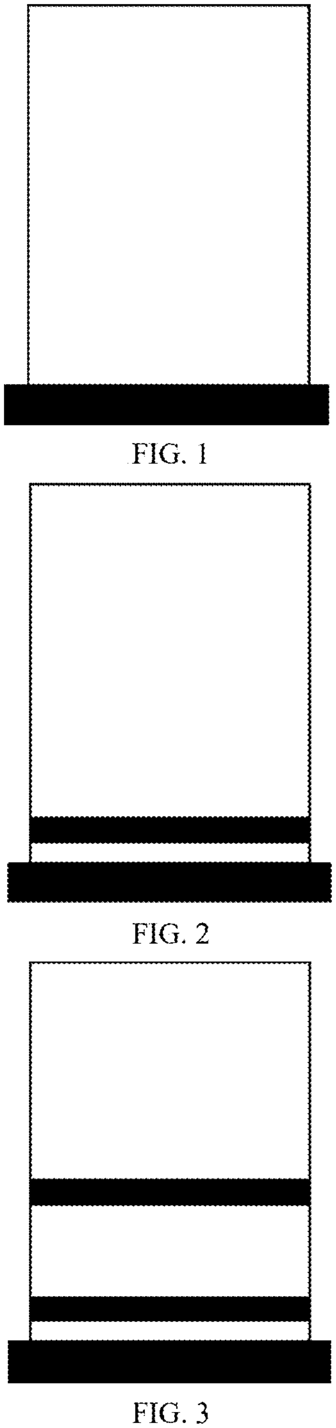
FIG. 1 is a schematic cross-sectional view of a two-dimensional material feature of the present invention.
FIG. 2 is a schematic cross-sectional view of a two-dimensional material feature after cluster implanted at one acceleration energy of the present invention.
FIG. 3 is a schematic cross-sectional view of a two-dimensional material feature after cluster implanted at two different acceleration energies of the present invention.
Figure 7:
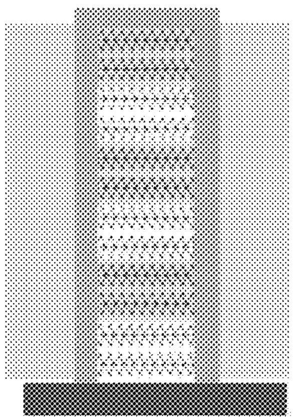
FIG. 7 is a schematic cross-sectional view of a cluster ion implanted two-dimensional full ring grid transistor atomic layer resolution feature of the present invention.

The embodiments of the present invention will now be described more fully hereinafter with reference to the accompanying drawings.

According to the method for doping a two-dimensional material based on cluster ion implantation of the present invention, a single-molecule system of atoms @ molecules is used as a storage medium of an atom memory, which not only makes full use of the protection characteristics of molecules for atoms but also makes use of the property features of electronically controlled atomic states to implement a doping amount on a semiconductor sample, so as to obtain a carrier concentration and mobility of the same order of magnitude as the doping amount, so as to further improve the performance of a device such as a diode and a solar cell prepared thereby. The method for doping a two-dimensional material based on cluster ion implantation specifically includes:

- step I, selecting a two-dimensional material sample to place it on a substrate;
- step II, determining the selected implantation parameters by Monte Carlo particle tracing algorithm on a two-dimensional material sample;
- step III, replacing the two-dimensional material sample, and placing a two-dimensional material thin film, wherein the thickness of the two-dimensional material thin film is ≤10 nm;
- step IV, selecting a determined implantation parameter to form a cluster beam and acting on a two-dimensional material thin film;
- step V, changing the implantation parameters to form different cluster beams and acting on the two-dimensional material thin film;
- step VI, performing annealing on the two-dimensional material thin film implanted with cluster ions to repair the damage caused by implantation.

The Monte Carlo particle tracing algorithm, firstly, uses computer simulation to obtain the relationship between an implantation parameter and an implantation depth; secondly, according to the simulation result, selecting implantation parameters, wherein the implantation parameters comprise the energy size of the cluster ion beam, the size of the cluster and the element type of the cluster; the cluster beam formed after selecting the parameters is implanted into the two-dimensional material sample, and the simulation results are corrected by debugging the selected parameters to obtain the numerical distribution after the clusters implanted into the sample and the substrate thereof, and finally the relationship between the actual implantation parameters and the implantation depth is obtained, and the selected implantation parameters are determined.

The substrate is a semiconductor material or an insulator material. In a further embodiment, the semiconductor material is silicon, silicon dioxide, or graphene oxide; the insulator material is sapphire, mica sheet, or alumina.

The two-dimensional material is a transition metal dichalcogenide (TMD) $MoSe_2$ or $MoS_2$. The present invention achieves nanoscale P-type doping to a specific depth of a two-dimensional material by cluster ion implantation.

By changing the implantation parameters, and changing the energy size of the cluster beam and the element species of the cluster, the nanoscale P (N)-type doping at different depths of two-dimensional materials can be controllably achieved, so as to form multiple conductive channels in a similar stack. The implantation parameter refers to the energy size of the cluster beam, the size of the cluster, and the element species of the cluster, and in a further embodiment, the element of the cluster is an $Nb_n^+$ cluster which is a positively charged ion cluster or an $As_n^-$ cluster which is a negatively charged ion cluster; here n is the size of the cluster, i.e. the number of atoms in it. The number of atoms in the cluster ranges from two or more, preferably ten. By changing the size of the cluster, i.e. the number of atoms in it, the implantation depth of the cluster in the two-dimensional material can be controllably adjusted. Under the same ion acceleration energy, the smaller the cluster size is, the larger the implantation depth is; while the larger the cluster is, the smaller the implantation depth is. By changing the energy of ion acceleration, the implantation depth of clusters in a two-dimensional material can be controllably adjusted. For clusters of the same size, the greater the ion acceleration energy, the deeper the cluster implantation depth in two-dimensional materials. The implantation depth of clusters in two-dimensional materials is relatively uniform with a depth error of a few nanometers at specific ion acceleration energy. By choosing several specific ion acceleration energies, layered implantation of clusters in two-dimensional materials can be achieved, with the implantation range of each layer being relatively uniform, with an error of a few nanometers.

the annealing treatment can repair the damage to the crystal lattice, and a better effect can be obtained by selecting a suitable annealing parameter; for a specific two-dimensional material $MoSe_2$, the preferred annealing parameter thereof is annealing at 400-600° C. for 1-2 h in a nitrogen atmosphere, and the more preferred annealing parameter thereof is annealing at 500° C. for 2 h in a nitrogen atmosphere; for the specific two-dimensional material $MoS_2$, the preferred annealing parameter is 200-400° C. for 1-2 h in a nitrogen atmosphere, and the more preferred annealing parameter is 300° C. for 2 h in a nitrogen atmosphere.

Figure 12:
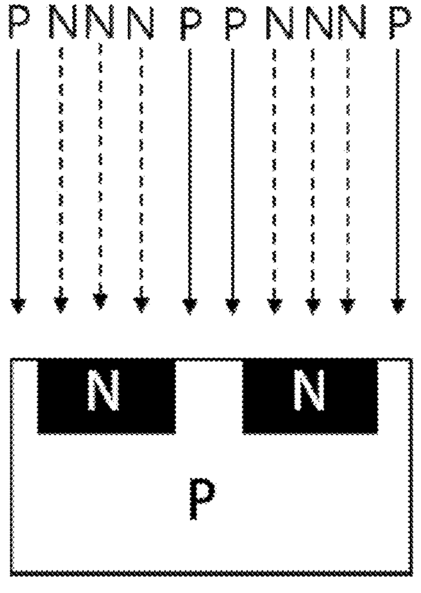
FIG. 12 is a schematic view of positively and negatively charged ion cluster implantation.
Figure 12:
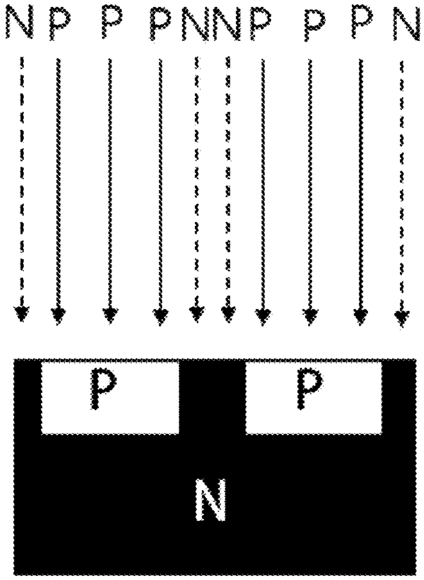

The method enables the doping of two-dimensional materials, in particular doping of P-type junctions. As shown in FIG. 12, wherein the solid arrows are positively charged ion cluster implantation, such as $Nb_n^+$ clusters; dashed arrows are negatively charged ion cluster implantation, such as $As_n^-$ clusters.

The invention will now be further described with reference to the following examples.

Example I—Cluster Ion Implantation $MoSe_2$

Figure 8:
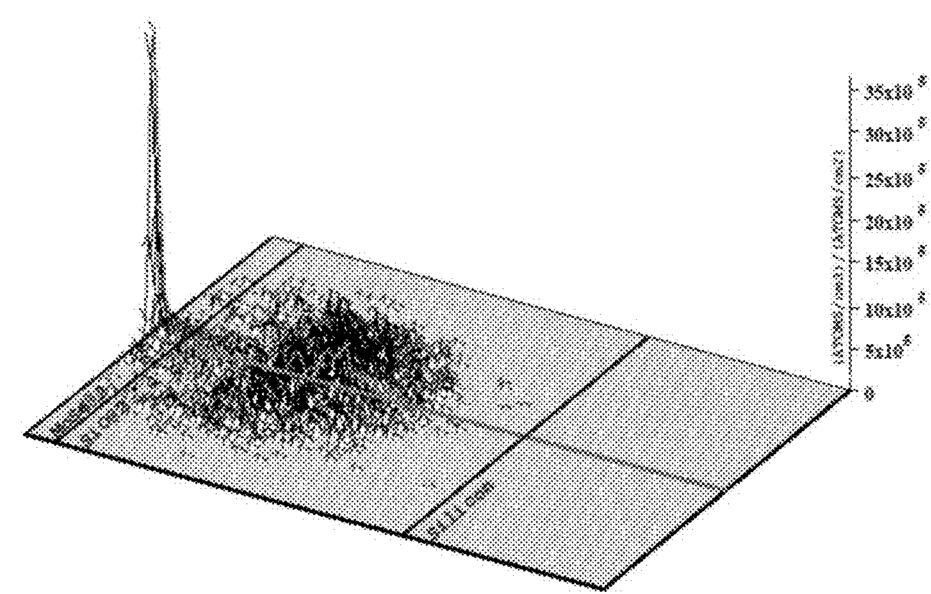
FIG. 8 is a Monte Carlo atomic tracing of the present invention for implanting $Nb_{10}$ clusters into $MoSe_2$ at an energy of 2.2 keV.
Figure 9:
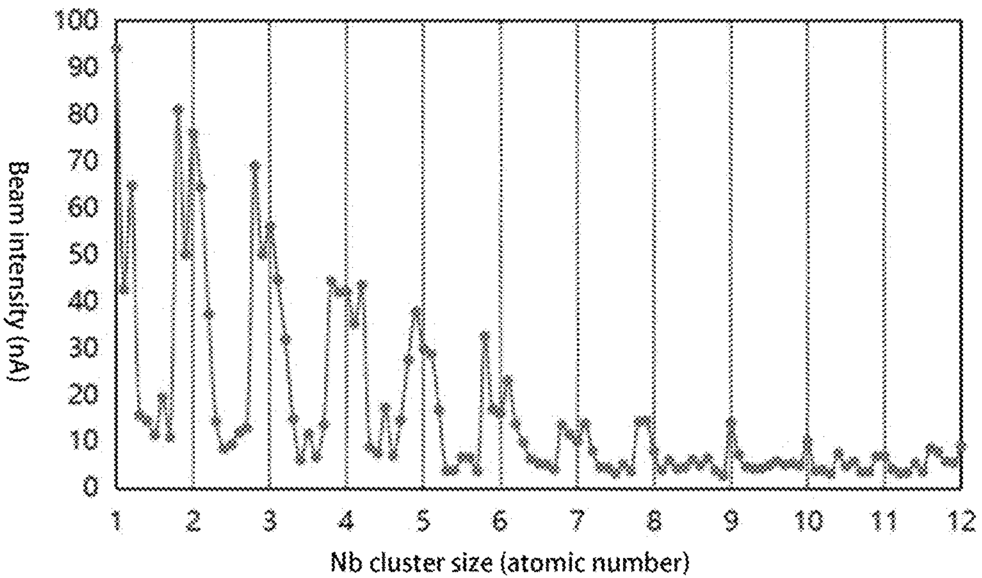
FIG. 9 is a view showing an example of a beam mass spectrum of the Nb atom cluster of the present invention.

Step 1: a Monte Carlo particle tracing algorithm was used to trace the implantation depth of a MoSe2 sample implanted on a silicon wafer substrate with 3 keV energy by $Nb_{10}^+$ clusters, as shown in FIG. 8, wherein the XY plane in the figure was a cross-sectional view of the target $MoSe_2$ and the substrate thereof, and the Z axis was the number distribution of the implanted $Nb_{10}^+$ clusters at each cross-sectional depth, and the figure showed the numerical distribution after the clusters implanted into the sample and the substrate thereof;

Step 2: the beam of Nb atom clusters was debugged using a cluster beam source, and after the debugging was completed, it was available from the mass spectrogram that a single $Nb^+$ atom beam could reach a level close to 100 nA, and the $Nb_{10}^+$ cluster was about 10 nA, with one charge per cluster, as shown in FIG. 9.

Step 3: after the cluster beam debugging was completed, a certain amount of cluster implantation was completed on the $MoSe_2$ thin film using $Nb_{10}^+$ clusters; and the standard of deposition amount was determined by the beam spot size and required coverage rate. In this experiment, the beam spot size was 1 cm*1 cm, and the surface coverage target was 10%.

Figure 10:
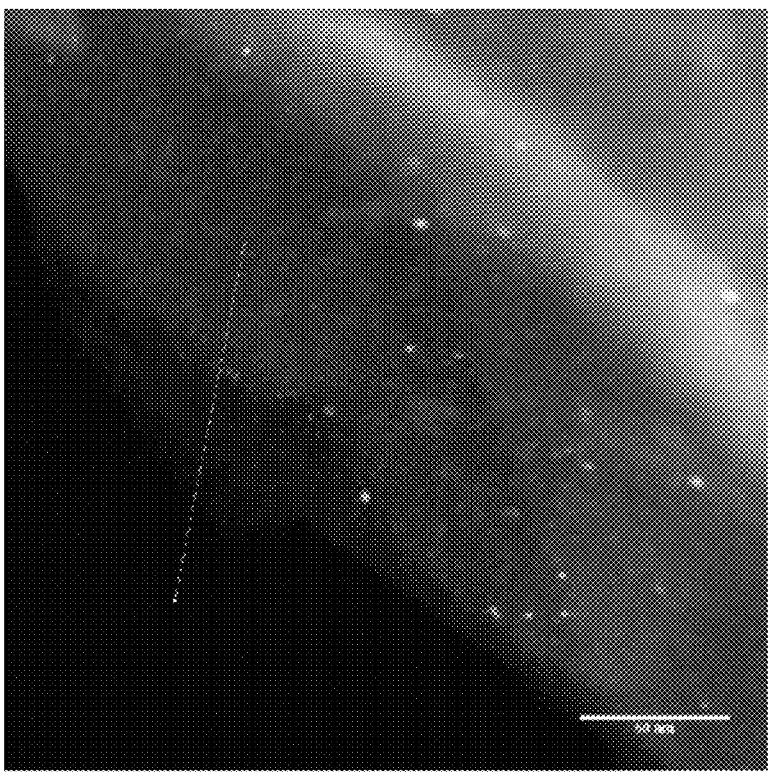
FIG. 10 is a schematic view showing how different depths can be accurately controlled by implanting samples under different implantation conditions according to the present invention.

Step 4: samples with non-uniform thickness on the carbon mesh were implanted under different implantation conditions, and the cluster implantation depth was observed by using a spherical aberration electron microscope after the implantation conditions were changed. As shown in FIG. 10, the expected effect was achieved when the experimental results were basically consistent with the simulation results of the Monte Carlo algorithm.

Step 5: after the sample implantation was completed, an annealing process should be used to stabilize the crystal lattice thereof. At present, annealing at 500° C. for 2 h in a nitrogen atmosphere was better.

Figure 11:
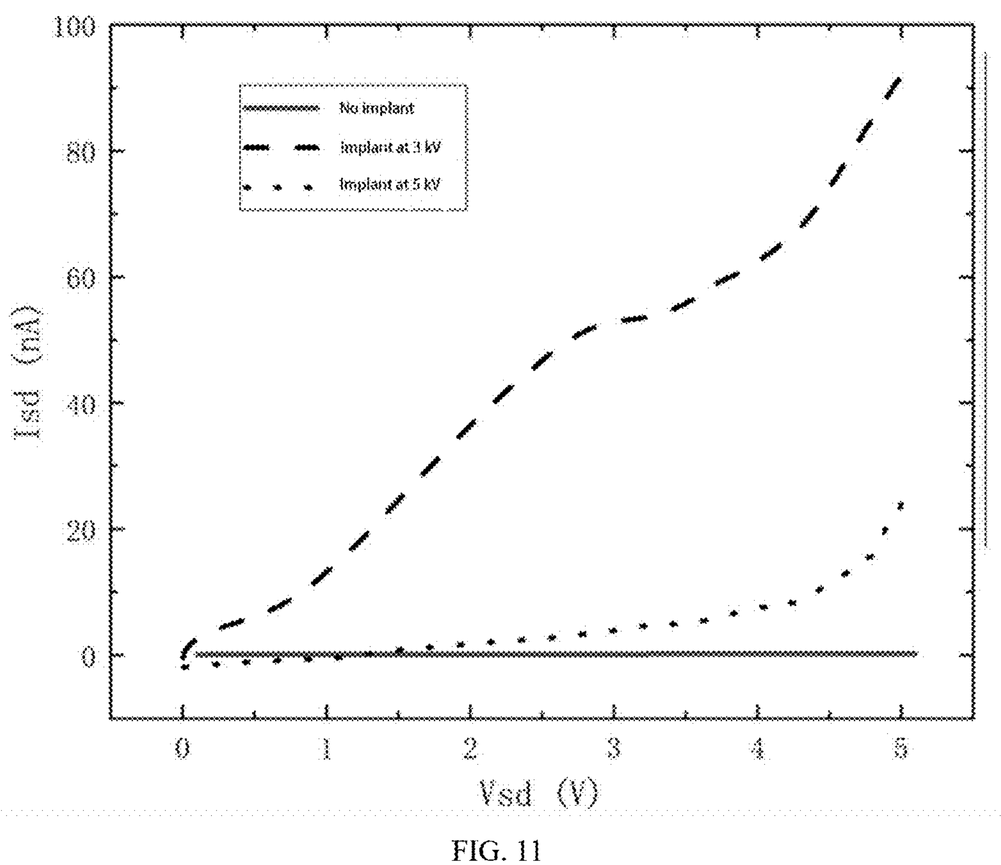
FIG. 11 is a graph showing an example of I-V curves of $Nb_{10}$ cluster ion implanted into a four-layer $MoSe_2$ of the present invention at different implantation energies.

The samples were top-grid controlled with an ionic liquid, currently, 1-butyl-3-methylimidazolium bis[(trifluoromethyl)sulfonyl]imide was used as the ionic liquid grid. The IV curves of the four-layer MoSe2 with different implant energies were measured at 235 K as shown in FIG. 11. At an energy of 3 keV, the conductivity of MoSe2 was significantly improved and a partial P-type electrical feature was observed.

Example II—Cluster Ion Implantation $MoS_2$

Figure 13:
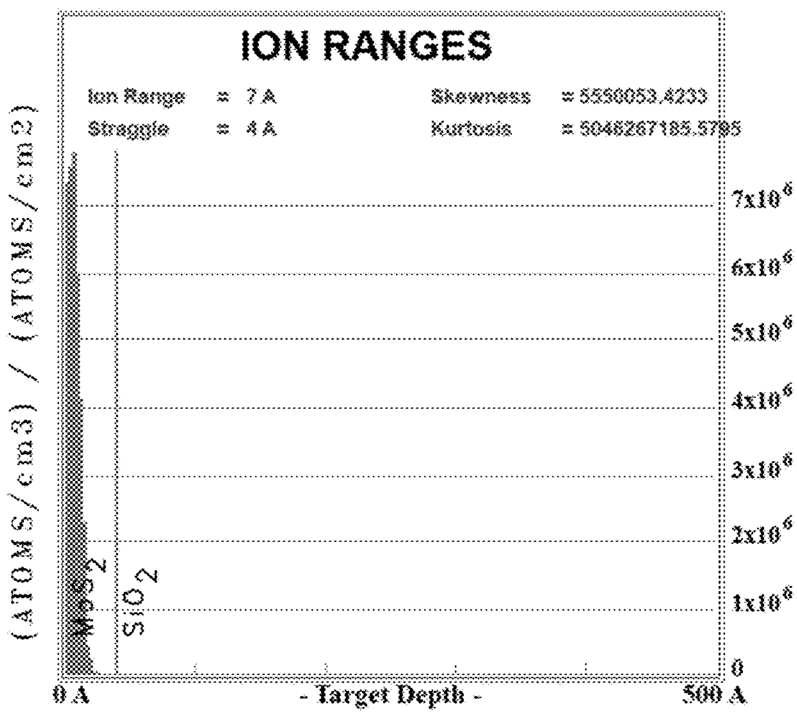
FIG. 13 is a graph of Monte Carlo simulations of different acceleration voltage implants into different depths according to the present invention, and the figure is a schematic view where a 500 V implantation depth is the thickness of one layer of $MoS_2$.
Figure 14:
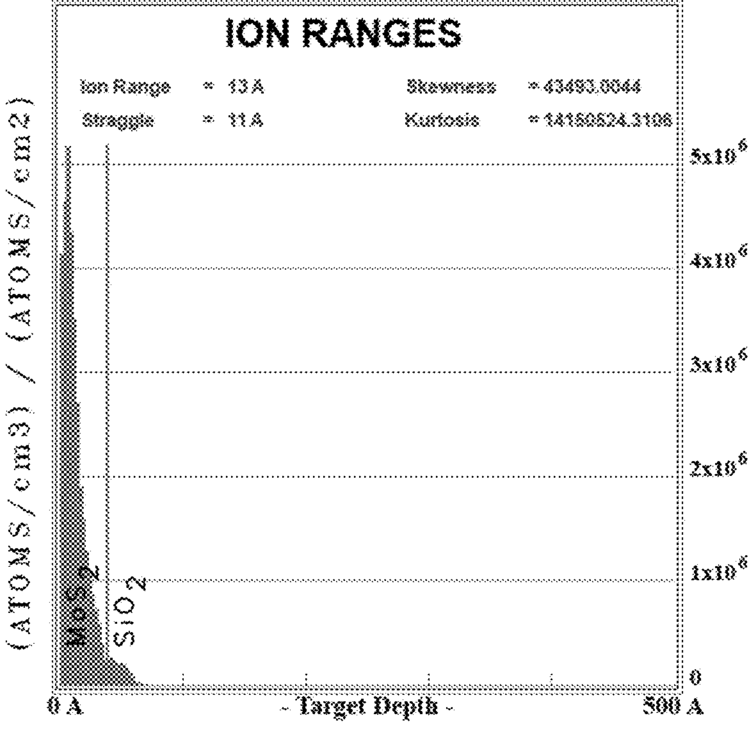
FIG. 14 is a graph of Monte Carlo simulations of different acceleration voltage implants into different depths according to the present invention, and the figure is a schematic view where a 3000 V implantation depth is the thickness of two layers of $MoS_2$.
Figure 15:
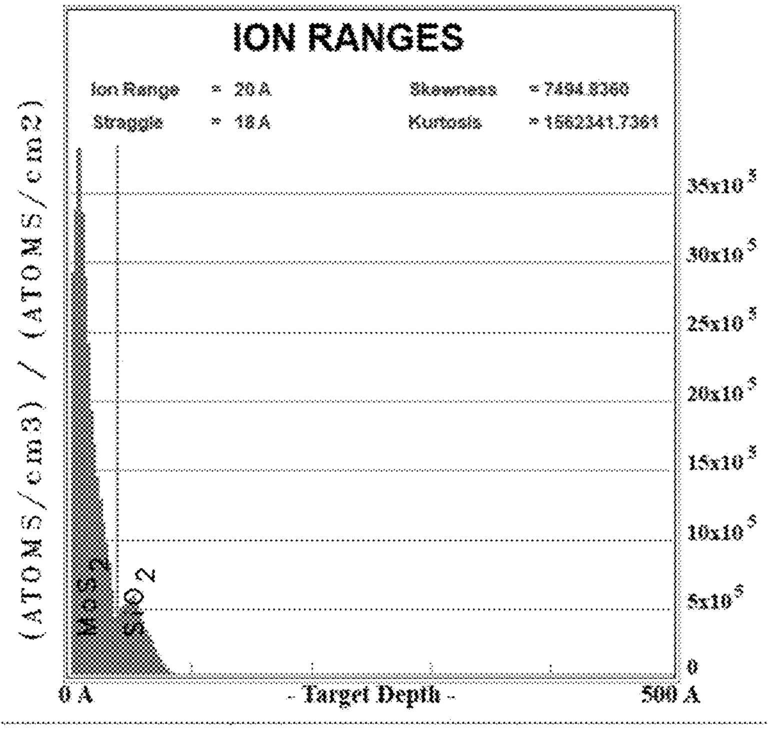
FIG. 15 is a graph of Monte Carlo simulations of different acceleration voltage implants into different depths according to the present invention, and the figure is a schematic view where an 8000 V implantation depth is the thickness of three layers of $MoS_2$.

Step 1: a Monte Carlo particle tracing algorithm was used to precisely trace the implantation movement of the clusters at different energies, resulting in specific implantation depths that can be obtained at different acceleration energies, as shown in FIGS. 13-15.

Figure 16:
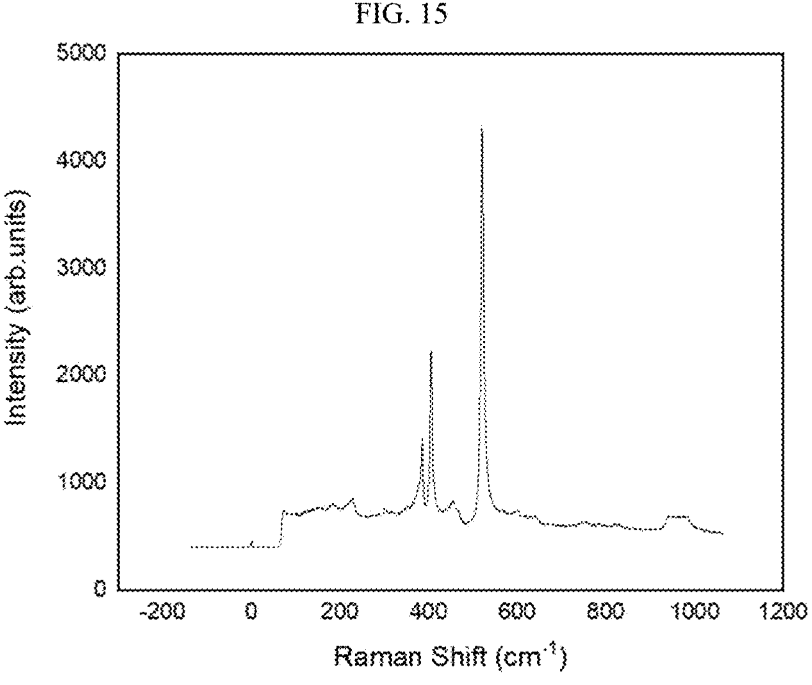
FIG. 16 is a Raman spectrum of an implanted semiconductor sample $MoS_2$ used in the present invention.
Figure 17:
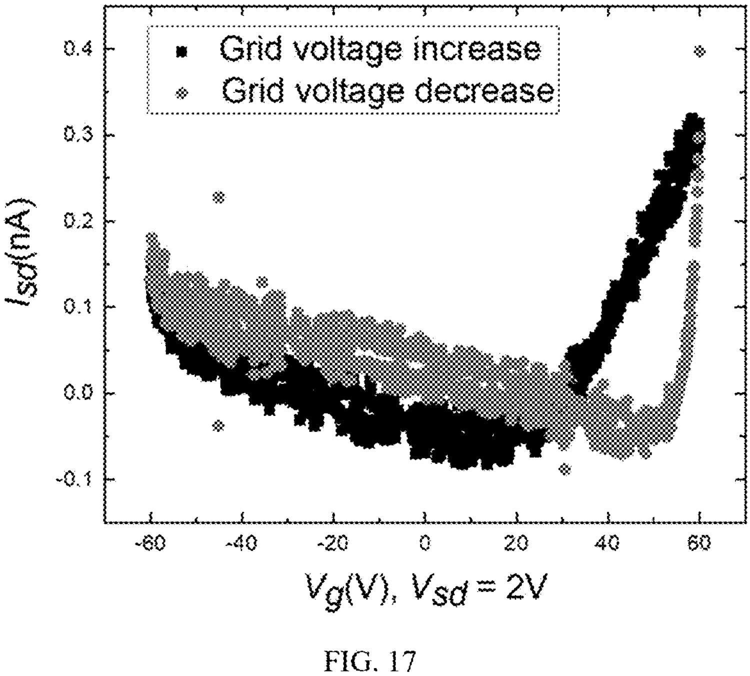
FIG. 17 is a graph of transport evidence for the conversion of N-type $MoS_2$ to P-type.

Step 2: $MoS_2$ was prepared as an implanted sample using a chemical vapour deposition method, and the Raman spectrum measurement was performed thereon; wherein when the peak position of $MoS_2$ was 383 $cm^{-1}$, 408 $cm^{-1}$, and the peak position of $SiO_2$ was 519.9 $cm^{-1}$, the cluster ion implantation effect was the best, as shown in FIG. 16.

Step 3: $Nb_{10}^+$ clusters were implanted, and the implantation amount of the example was adjusted to 8.7E17/cm3, which met the heavy doping criteria.

Step 4: after the sample implantation was completed, it was annealed at 300° C. for 2 h in a nitrogen atmosphere to repair the sample damage caused by implantation.

After the above sample implantation annealing was completed, a transport measurement was performed, and a device was connected using a three-terminal method, wherein a silicon oxide substrate was selected as a back grid, and a grid electrode was connected on the side of a silicon wafer so as to form a semiconductor P-type device. After the device was prepared, a field sweep from −60 V to 60 V was performed on the grid voltage by fixing the drain-source voltage at 2 V to obtain a transport curve, so as to test whether the sample exhibited P-type and completed the modification of the semiconductor sample by cluster implantation.

The present invention also comprises a preparation method for obtaining a transistor device based on a two-dimensional material PN junction using the above-mentioned method for doping a two-dimensional material based on cluster ion implantation and specifically comprises:

selecting a two-dimensional material TMD to place it on a substrate; the substrate is a semiconductor material or an insulator material, as shown in FIG. 1, wherein the black rectangle at the bottom is a silicon-based substrate;

the selected implantation parameters are determined by the above-mentioned Monte Carlo particle tracing algorithm, and cluster ion implantation is performed for the first time, wherein the energy usage value is 9 keV, and the implanted layer is as shown in FIG. 2;

then performing a second cluster ion implantation, wherein the energy usage value is 6 keV, and the implanted layers are as shown in FIG. 3;

then performing a third cluster ion implantation, wherein the energy usage value is 3 keV, and the implanted layers are as shown in FIG. 4 and form stacked P-type and N-type regions as shown.

Performing an etching annealing process treatment, as shown in FIG. 5;

performing preparation of the grid and peripheral circuits, as shown in FIG. 6, to form TMD two-dimensional complementary semiconductor field effect transistors, i.e. transistor devices based on two-dimensional material PN junctions.

The present invention achieves microscopic PN junctions with higher integration density and switching efficiency by a method for doping a two-dimensional material based on cluster ion implantation. If the transistor formed using the microscopic PN junction has an N(P)-type semiconductor characteristic, the semiconductor characteristic thereof can be modified by P(N)-type doping; by P(N) type doping, complementary semiconductor field effect transistors can be realized.

The foregoing is illustrative and explanatory of the present invention, similar alternatives to the specific embodiments described by those skilled in the art without departing from the description of the invention or exceeding the scope defined by the claims, should all fall within the scope of the present invention.

The invention claimed is:

1. A method for doping a two-dimensional material based on cluster ion implantation, comprising the following step:

S1. selecting a two-dimensional material sample to place on a substrate;

S2. determining selected implantation parameters by Monte Carlo particle tracing algorithm on the two-dimensional material sample;

S3. replacing the two-dimensional material sample, and placing a two-dimensional material thin film, wherein a thickness of the two-dimensional material thin film is ≤10 nm;

S4. selecting a determined implantation parameter to form a cluster beam and acting on the two-dimensional material thin film;

S5. changing implantation parameters to form different cluster beams and acting on the two-dimensional material thin film;

S6. performing annealing on the two-dimensional material thin film implanted with cluster ions to repair the damage caused by implantation;

wherein the Monte Carlo particle tracing algorithm uses computer simulation to obtain a relationship between an implantation parameter and an implantation depth; and according to the computer simulation result, selecting implantation parameters, wherein the implantation parameters comprise an energy size of a cluster ion beam, a size of a cluster and an element type of the cluster;

wherein a cluster beam formed after selecting the implantation parameters is implanted into the two-dimensional material sample, and the computer simulation results are corrected by debugging the selected implantation parameters to obtain a numerical distribution based upon the clusters implanted into the sample and the substrate thereof, and wherein the relationship between actual implantation parameters and implantation depths is obtained, and the selected implantation parameters are determined.

2. The method for doping a two-dimensional material based on cluster ion implantation of claim 1, wherein the substrate is a semiconductor material or an insulator material.

3. The method for doping a two-dimensional material based on cluster ion implantation of claim 2, wherein the semiconductor material is silicon, silicon dioxide, or graphene oxide; the insulator material is sapphire, mica sheet, or alumina.

4. The method for doping a two-dimensional material based on cluster ion implantation of claim 1, wherein the two-dimensional material is transition metal dichalcogenide (TMD).

5. The method for doping a two-dimensional material based on cluster ion implantation of claim 4, wherein elements of the cluster are $Nb_n$+ clusters of positively charged ion clusters or $As_n$- clusters of negatively charged ion clusters; the $n \geq 2$.

6. The method for doping a two-dimensional material based on cluster ion implantation of claim 5, wherein the two-dimensional material is $MoSe_2$, and the Monte Carlo particle tracing algorithm is used to trace an implantation depth of a $MoSe_2$ sample implanted on a substrate by $Nb_{10}$+ clusters at an energy of 3 keV; a cluster beam source is used to debug the beam of Nb atom clusters; after the cluster beam debugging is completed, a certain amount of cluster implantation is completed on the $MoSe_2$ thin film using $Nb_{10}$+ clusters; after the sample implantation is completed, an annealing process is used to stabilize a crystal lattice thereof.

7. The method for doping a two-dimensional material based on cluster ion implantation of claim 6, wherein the annealing process is annealing at 500° C. for 2 hours in a nitrogen atmosphere.

8. The method for doping a two-dimensional material based on cluster ion implantation of claim 5, wherein the two-dimensional material is $MoS_2$, and the Monte Carlo particle tracing algorithm is used to accurately trace an implantation movement of the clusters under different energies, so as to obtain a specific implantation depth under different acceleration energies; $MoS_2$ is prepared as an implanted sample using a chemical vapor deposition method, and the Raman spectrum measurement is performed thereon; $Nb_{10}$+ clusters are implanted, and after the sample implantation is completed, the annealing process is used to stabilize the crystal lattice thereof.

9. The method for doping a two-dimensional material based on cluster ion implantation of claim 8, wherein the annealing process is annealing at 300° C. for 2 hours in a nitrogen atmosphere.

10. A method for preparing a transistor device using the method for doping a two-dimensional material based on cluster ion implantation of any one of the preceding claims, the method comprising: selecting a two-dimensional material TMD to place it on a substrate; determining selected implantation parameters, and performing a first cluster ion implantation on the two-dimensional material TMD sample placed on the substrate, wherein an energy usage value is 9 keV; then performing a second cluster ion implantation, wherein the energy usage value is 6 keV; then performing a third cluster ion implantation, wherein the energy usage value is 3 keV, and similar stacked P-type and N-type regions are formed in the sample; performing annealing on the sample; preparing samples for grid and peripheral circuitry.

* * * * *